United States Patent
Bacos et al.

(10) Patent No.: US 10,100,396 B2
(45) Date of Patent: Oct. 16, 2018

(54) METHOD AND SYSTEM FOR DEPOSITING OXIDE ON A POROUS COMPONENT

(71) Applicant: Office National D'Etudes et de Recherches Aerospatiales, Palaiseau (FR)

(72) Inventors: Marie-Pierre Bacos, Antony (FR); Frederic Rousseau, Esclavolles Lurey (FR); Daniel Morvan, Paris (FR)

(73) Assignee: Office National D'Etudes et de Recherches Aerospatiales, Palaiseau (FR)

( * ) Notice: Subject to any disclaimer, the term of this patent is extended or adjusted under 35 U.S.C. 154(b) by 121 days.

(21) Appl. No.: 15/101,037

(22) PCT Filed: Dec. 1, 2014

(86) PCT No.: PCT/FR2014/053103
§ 371 (c)(1),
(2) Date: Jun. 2, 2016

(87) PCT Pub. No.: WO2015/082819
PCT Pub. Date: Jun. 11, 2015

(65) Prior Publication Data
US 2017/0002452 A1    Jan. 5, 2017

(30) Foreign Application Priority Data
Dec. 2, 2013  (FR) ..................................... 13 61945

(51) Int. Cl.
*H05H 1/24* (2006.01)
*C23C 4/11* (2016.01)
(Continued)

(52) U.S. Cl.
CPC .................. *C23C 4/11* (2016.01); *C23C 4/01* (2016.01); *C23C 4/134* (2016.01); *C23C 16/455* (2013.01);
(Continued)

(58) Field of Classification Search
CPC .. C23C 4/11; C23C 4/01; C23C 4/134; C23C 16/455; C23C 16/50; C23C 16/52
See application file for complete search history.

(56) References Cited

U.S. PATENT DOCUMENTS 4,402,992 A    9/1983  Liebert
4,743,462 A    5/1988  Radzavich et al.
(Continued)

FOREIGN PATENT DOCUMENTS

| EP | 1 010 772 | 6/2000 |
| FR | 2 729 400 | 7/1996 |
| WO | WO 2015/082818 A1 | 6/2015 |

OTHER PUBLICATIONS

Morsi et al. Effect of Air Plasma Sprays Parameters on Coating Performance in Zirconia-Based Thermal Barrier Coatings, Int. J. Electrochem. Sci., 7 (2012) 2811-2831. (Year: 2012).*
(Continued)

*Primary Examiner* — Kelly M Gambetta
(74) *Attorney, Agent, or Firm* — Dority & Manning, P.A.

(57) ABSTRACT

The invention relates to a method and system for forming a layer of oxide on a pervious component made of a material or a stack of materials that are stable at 400° C., said component including an outer surface to be coated and at least one pore with a diameter of 50 to 1000 µm leading onto said outer surface. Said method includes the following steps: a) injecting a carrier gas loaded with droplets of at least one precursor of the oxide into a low-pressure plasma inside an
(Continued)

enclosure of a plasma reactor housing the component to be coated, and injecting a fluid passing through the pervious component and flowing in gaseous state through said at least one pore with a flow opposite to that of the carrier gas in the plasma chamber in order to avoid the clogging of the pore, the pressure and the mass flow of said fluid upstream of the pervious component being such that the pressure of the gas at the outlet of the at least one pore is higher than the pressure in the plasma chamber, and the injection mass flow of the fluid passing through the pervious component is: α) less than or equal to the mass low of the carrier gas loaded with precursor of the oxide injected into the plasma chamber, and β) greater than or equal to the product of the mass flow of the carrier gas loaded with precursors of the oxide injected into the plasma chamber by the ration between the total surface of the open pores of the pervious component and the surface of the passage section of the plasma chamber, thus, the speed of the gas at the outlet of the at least one pore is no lower than the intake speed of the carrier gas loaded with at least one precursor of the oxide in, non-preferentially, the liquid, gel or solid state thereof, on the outer surface of the component; b) injecting a carrier gas not loaded with a precursor of the oxide into a plasma inside the plasma chamber, wherein the injection of the fluid passing through the pervious component is maintained and steps a) and b) are repeated, such as to form said oxide on the outer surface, the diameter of the at least one pore being preserved.

14 Claims, 2 Drawing Sheets

(51) Int. Cl.
  *F01D 5/28* (2006.01)
  *C23C 4/01* (2016.01)
  *C23C 4/134* (2016.01)
  *C23C 16/455* (2006.01)
  *C23C 16/50* (2006.01)
  *C23C 16/52* (2006.01)
  *F01D 5/00* (2006.01)
  *F01D 5/18* (2006.01)

(52) U.S. Cl.
  CPC ............. *C23C 16/50* (2013.01); *C23C 16/52* (2013.01); *F01D 5/288* (2013.01); *B23P 2700/06* (2013.01); *F01D 5/005* (2013.01); *F01D 5/186* (2013.01); *F05D 2230/312* (2013.01); *F05D 2230/314* (2013.01); *F05D 2230/80* (2013.01); *F05D 2240/35* (2013.01); *F05D 2260/202* (2013.01); *F05D 2300/175* (2013.01); *F05D 2300/20* (2013.01); *F05D 2300/2112* (2013.01); *F05D 2300/2118* (2013.01); *Y02T 50/671* (2013.01)

(56) References Cited

U.S. PATENT DOCUMENTS

| | | | |
|---|---|---|---|
| 5,216,808 A | 6/1993 | Martus et al. | |
| 5,399,388 A | 3/1995 | Aklufi | |
| 5,538,796 A | 7/1996 | Schaffer et al. | |
| 5,565,035 A | 10/1996 | Sylvestro et al. | |
| 5,585,136 A | 12/1996 | Barrow et al. | |
| 5,603,771 A | 2/1997 | Seiberras et al. | |
| 5,702,288 A | 12/1997 | Liebke et al. | |
| 5,775,108 A | 7/1998 | Ansart et al. | |
| 5,800,695 A | 9/1998 | Kang et al. | |
| 5,985,122 A | 11/1999 | Conner | |
| 6,004,620 A | 12/1999 | Camm | |
| 6,025,034 A | 2/2000 | Strutt et al. | |
| 6,032,361 A | 3/2000 | Makino et al. | |
| 6,126,396 A | 10/2000 | Doughty et al. | |
| 6,183,811 B1 * | 2/2001 | Conner | C23C 10/04 427/142 |
| 6,210,488 B1 | 4/2001 | Bruce | |
| 6,235,352 B1 | 5/2001 | Leverant et al. | |
| 6,258,226 B1 | 7/2001 | Conner | |
| 6,365,013 B1 * | 4/2002 | Beele | C23C 4/12 118/300 |
| 6,408,610 B1 | 6/2002 | Caldwell et al. | |
| 6,579,573 B2 | 6/2003 | Strutt et al. | |
| 6,667,076 B2 * | 12/2003 | Fried | C23C 4/00 29/889.721 |
| 6,875,464 B2 | 4/2005 | Ruud et al. | |
| 7,008,522 B2 | 3/2006 | Boucard et al. | |
| 7,093,993 B2 | 8/2006 | Skoog et al. | |
| 7,094,450 B2 | 8/2006 | Nagaraj et al. | |
| 7,115,832 B1 | 10/2006 | Blankenship et al. | |
| 7,273,662 B2 | 9/2007 | Gleeson et al. | |
| 7,476,703 B2 | 1/2009 | Ruud et al. | |
| 7,482,039 B2 | 1/2009 | Bacos et al. | |
| 7,588,797 B2 | 9/2009 | Skoog et al. | |
| 7,670,112 B2 | 3/2010 | Boury et al. | |
| 7,842,335 B2 | 11/2010 | Skoog et al. | |
| 8,221,825 B2 | 6/2012 | Reitz et al. | |
| 2004/0258611 A1 | 12/2004 | Barrow et al. | |
| 2005/0003097 A1 | 1/2005 | Philip et al. | |
| 2005/0129868 A1 | 6/2005 | Philip et al. | |
| 2007/0160859 A1 | 7/2007 | Darolia et al. | |
| 2007/0202269 A1 | 8/2007 | Potter et al. | |
| 2011/0287191 A1 | 11/2011 | Martin et al. | |

OTHER PUBLICATIONS

Abstract of WO 2011/144860, Nov. 24 2011.
Fourmond, "Synthése d'oxydes par plasma. Mise au point d'un rèacteur plasma pour les tests de résistance au CMAS." ["Synthesis of oxides by plasma. Development of a plasma reactor for strength tests at CMAS"] Doctoral thesis from the Université Pierre et Marie Curie defended on Nov. 29, 2011.
L. Pin et al., "Processing, repairing and cycling oxidation behaviour of sol-gel thermal barrier coating", Surface and Coatings Technology, vol. 206, No. 7, Jun. 29, 2011, pp. 1609-1614.
M. Gell. et al., "Highly durable thermal barrier coatings made by the solution precursor plasma spray process", Surface and Coating Technology, vol. 177-178, Jan. 2004, pp. 97-102.
Padture. et al., "Toward durable thermal barrier coatings with novel microstructures deposited by solution-precursor plasma splay", Acta Materialia, vol. 40, No. 12, Jul. 17, 2001, pp. 2251-2257.
S. Angel et al, Open Porous Metallic Foams with Thermal Barrier Coatings and Cooling Hole Array for High Temperature Turbine Applications;, *High Temperatures Material Processes*, vol. 11, issue 3, Nov. 11, 2007, pp. 321-343.
S. Krämer, et al., "Infiltration-Inhibiting Reaction of Gadolinium Zirconate Thermal Barrier Coatings with CMAS Melts," Journal of the American Ceramic Society, vol. 91, No. 2, Dec. 7, 2007, pp. 576-583.
Rousseau F. et al., "Deposition of thick and 50% porous YpSZ layer by spraying nitrate solution in a low pressure plasma reactor", Surface & Coatings Technology, vol. 206, No. 7, Jun. 29, 2011, pp. 1621-1627.
International Search Report for PCT/FR2014/053103, dated Mar. 26, 2015, 2 pages.

* cited by examiner

METHOD AND SYSTEM FOR DEPOSITING OXIDE ON A POROUS COMPONENT

CROSS REFERENCE TO RELATED APPLICATION

This application is the national stage entry of International Patent Application No. PCT/FR2014/053103 having a filing date of Dec. 1, 2014, which claims priority to and the benefit of French Patent Application No. 1361945 filed in the French Intellectual Property Office on Dec. 2, 2013, the entire contents of which are incorporated herein by reference.

The invention relates to a method for depositing oxide on permeable components that are to receive a surface coating.

The use of components with open pores, such as for instance those equipped with cooling channels, is common in many applications. Among those include the blades of high pressure turbines in turbomachines, in particular aviation turbomachines, and aeronautic or terrestrial combustion chambers. Turbine blades are typically cooled by air, sampled in the compressor, air which is injected into the foot of the blade (fir tree roots) and that passes through the blade through channels unblocking at the surface, and more specifically near the leading edge and the trailing edge. U.S. Pat. No. 7,670,112 and U.S. Pat. No. 6,126,396 give examples of blades cooled by multiple channels.

The combustion chambers of engines also have cooling channels or cavities. Many examples of this type of chamber are published in the literature, such as for example U.S. Pat. No. 5,775,108 and EP 0892218 or S. Angel et al in *High Temperature Material Processes* 11 (2007) 321-342.

The use of cooling channels in combination with depositing a thermal barrier on the surface, such as for example zirconium oxide partially stabilized with yttrium oxide, allows the use of these engine components at surface temperatures above the burn or melt temperature of the metal that constitutes the component.

Typically these thermal barriers are deposited on the component to be coated either by a projection technique (particularly thermal projection such as Air Plasma Spray (APS) or Low Pressure Plasma Spray (LPPS) or High Velocity Oxy Fuel (HVOF)) or by physical deposit in the vapor phase i.e. by evaporation (particularly by EB-PVD, Electron Beam Physical Vapor Deposition). Alternative techniques to the thermal plasma projection technique usually used have also been published, such as processes called SCP (Spray Conversion Processing) or SPPS (Solution Precursor Plasma Spray) described by publications U.S. Pat. No. 6,025,034 and US 2003/0077398. Other techniques for developing thick ceramic oxides or thermal barriers exist, such as CVD (Chemical Vapor Deposition) or PE-CVD (Plasma Enhanced-Chemical Vapor Deposition) published in FR 2695944, the sol-gel route published in U.S. Pat. No. 5,585,136 or the LPPR method (Low Pressure Plasma Reactor) published by Rousseau et al (Deposition of thick and 50% porous YpSZ layer by spraying nitrate solution in a low pressure plasma reactor, Surface and Coating Technology 206 (7) (2011) 1621-1627). This article discloses a method of forming a porous thermal barrier on a non-porous alumina substrate.

The thermal barriers deposited may be based on zirconium oxide or zirconia, particularly zirconium oxide stabilized with yttrium oxide also called yttria zirconia or YpSZ for "Yttria-Partially Stabilized Zirconia", cerium oxide, magnesium oxide or any other oxide.

Generally for the components of the combustion chamber type, the thermal barrier is deposited by plasma projection. For components like multi-perforated combustion chambers, where the cooling is by localized injection and where the metal part is dense and non-porous, the entire system is pierced—the combustion chamber coated with the thermal barrier—after the thermal barrier is deposited. For components like breathing combustion chambers, where the cooling is by transpiration or effusion and where the metal part has substantial open pores—for example constituted of a metal sponge or a stack of hollow spheres—the piercing takes place only in the thermal barrier after it is deposited. But the piercing operation is a long and expensive operation that requires the purchase of sophisticated and expensive tooling such as a perfected robotic laser. What is more, in the case of combustion chambers called airbreathing, laser piercing can cause substantial degradations like those described by S. Angel et al in *High Temperature Material Processes* 11 (2007) 321-342 in the case of a metal foam with open pores topped by a thermal barrier of zirconium oxide stabilized by yttrium oxide.

For turbine blades often coated by a thermal barrier by EB-PVD (Electron Beam Physical Vapor Deposition) or PVD (Physical Vapor Deposition), the cooling channels are pierced on the metal component before the metal sub-layer is deposited, typically by thermochemical aluminization method and before the thermal barrier is deposited by EB-PVD. Even if with the techniques used the deposit speeds are quite low (compared to plasma projection) after deposit the channels of the thermal barrier must be unblocked because a portion of the deposit penetrates the channels as indicated in FIG. 4 of publication U.S. Pat. No. 6,408,610.

The obstruction of holes in these cooling channels during deposit of the thermal barrier has the consequence of very hot spots appearing locally causing cracks or local fusions of the metal in the blade and degradation of the thermal barrier. This is why many processes have been published to prevent this phenomenon of obstruction or clogging holes when depositing a thermal barrier and to prevent the unblocking operation after the thermal barrier is deposited.

Many publications propose solutions to prevent holes being blocked by using stoppers that then evaporate, or maskants that must be placed individually in each hole, see U.S. Pat. No. 4,743,462, or in several holes at a time, see U.S. Pat. No. 5,985,122, U.S. Pat. No. 6,258,226, U.S. Pat. No. 5,565,035 and U.S. Pat. No. 5,800,695. But all these solutions are expensive in both time and tooling.

Other solutions consist in injecting into the component water at very high pressure, see U.S. Pat. No. 6,004,620, with or without an aggressive product such as sodium hydroxide, see U.S. Pat. No. 6,210,488, or injecting an abrasive, see U.S. Pat. No. 5,702,288, to unblock the channels. But this type of method creates pollution in the cooling channels that are subsequently harmful. Finally laser techniques, see U.S. Pat. No. 5,216,808, locally remove the thermal barrier that clogged the holes but these techniques are complex because they must be combined with machines that recognize pores in the components.

The Applicant has established during their research that the only possibility for preventing all these unblocking operations after the thermal barrier is deposited is to prevent the deposit of the thermal barrier from occurring in the open pore.

For the formation of the metallic sub-layer of the thermal barrier, EP 1010772 discloses a method that prevents the clogging of the cooling channels of a blade from a gas, whose pressure is controlled experimentally as a function of the component to be treated, a gas injected through the component in opposing flow to the precursors arriving on the component in the gaseous state. As indicated above, the precursors of aluminization are gaseous and this is an aluminization method in the vapor phase where the temperature necessary to generate the precursors of the deposit is well known to the person skilled in the art as typically about 1000-1100° C., the component to be treated being at the same temperature for the reaction to take place.

For the thermal barriers themselves, deposits of oxide made from gaseous (Physical Vapor Deposition or Gas Jet Sputtering process) or molten precursors (plasma projection by ion beam), U.S. Pat. No. 6,365,013 discloses that the reduction of the obstruction of holes in a permeable component by excess pressure in the gas injected through the pores of the component with flow opposing the precursors of the thermal barrier, requires preheating between 100 and 900° C. of gases to be injected and only applies to components whose total unblocking surface area is low, typically less than 2% of the total surface area of the component.

For the thermal barriers deposited by plasma spraying (by torch), U.S. Pat. No. 4,402,992 presents a system that reduces hole obstruction by using a system of neutral gas injected through cooling channels to obtain a reduction in obstruction in holes with diameter between 254 and 508 µm. With this method it is necessary to inject neutral gas at very high pressure, rising to 551,580 Pa (80 psia), and a mass flow rate between 2.2 to 6.8 $10^{-3}$ kg/s (0.005 to 0.015 $lb_m$/s) corresponding to an argon volume flow rate of 77 to 231 L/min. This method is therefore limited to high gas injection pressures and to neutral gases only. What is more, this method, expensive in both energy and gas, does not prevent clogging of all the holes. Finally the experimental conditions create turbulence effects on the surface of the component to be treated, which interferes with the quality and uniformity of the deposit.

The invention aims to remedy the drawbacks of the techniques above, identified by the Applicant. The Applicant has established that a need existed to coat perforated components with a high quality oxide-based coating with high retention of open perforations on the surface to be coated. Interest in coating components with substantial open pores exists, i.e. where the value of the ratio of the unblocking surface area to the total external surface area of the component to be coated may reach 30%, or even more.

More particularly, the invention proposes a method that can deposit an oxide on a permeable component, without clogging the open pores over a wide range of variation of the value of the unblocking surface area of the holes compared to the surface area of the component, using a controlled double injection, firstly, the injection of a carrier gas or of a mixture of carrier gases loaded in a low-pressure plasma where oxide precursors are introduced in the liquid, gel or solid states and, secondly, injecting a fluid crossing the permeable component and exiting it in the gaseous state with flow opposing that of the carrier gas, with a low mass flow rate.

According to a feature of the invention, a method of forming an oxide layer on a permeable component made of a material or a stack of materials stable at 400° C., said component comprising an outer surface to be coated and at least one pore having diameter between 50 and 1,000 µm leading to the outer surface, comprises the following steps:

a) Injecting a carrier gas loaded with droplets of at least one precursor of the oxide in a low-pressure plasma inside an enclosure of a plasma reactor housing the component to be coated, and injecting a fluid passing through the permeable component and flowing in the gaseous state through at least one pore with flow opposite that of the carrier gas in the plasma chamber to prevent clogging the pore, the pressure and the mass flow rate of said fluid upstream of the permeable component being such that the pressure of the gas at the outlet of the at least one pore is greater than the pressure in the plasma chamber and that the injection mass flow rate of the fluid passing through the permeable component is:

α) less than or equal to the mass flow rate of the carrier gas loaded with oxide precursors injected into the plasma chamber; and β) greater than or equal to the product of the mass flow rate of the carrier gas loaded with oxide precursors injected into the plasma chamber by the ratio between the total surface area of the open pores of the permeable component and the surface area of the passage section of the plasma chamber;

accordingly, the speed of the gas at the outlet of the at least one pore is greater than or equal to the intake speed of the carrier gas loaded with at least one oxide precursor in any of these states—liquid, gel or solid— on the outer surface of the component.

Indeed, the speed at the outlet of a pore depends only on the mass flow rate of the fluid injected and of the surface area of the hole outlet. Moreover, the person skilled in the art will find the necessary teaching to define the state of the choice of precursor in the patent application filed under number FR13.0061944 on Dec. 2, 2013 by the Applicant of this application.

b) Injecting the carrier gas not loaded with oxide precursor in a plasma within the plasma chamber, injecting the fluid passing through the permeable component being maintained steps a) and b) being repeated, to form on the outer surface said oxide, the diameter of the at least one pore being preserved.

The controlled injection of said fluid takes place through the permeable component with opposing flow to the oxide precursors introduced into the plasma. The fluid injected in the permeable component creates localized excess pressure (gas pressure) in the open pores opposing the formation of deposits in the unblocking pores. The injection parameters can be set as a function of the reactor pressure, of the speed of the carrier gas loaded with oxide precursors injected into the plasma chamber, and of the permeability of the permeable component to be coated. The injection can be controlled by measuring the pressure of the fluid injected upstream of the permeable component to be coated and of the mass flow rate of said injection fluid. Optionally a controller between the pressure parameters of the reactor, mass flow rate of the carrier gas loaded with oxide precursors, mass flow rate of the injection fluid passing through the permeable material and the pressure upstream of the permeable component to be coated can be made to ensure that the regime is laminar (Reynolds number below 2,100). The fluid used may be air, a neutral gas, water or another solvent that is chemically compatible with the component to be coated. Selecting an appreciably non-turbulent regime reduces the risk of deactivating the plasma in the reactor.

The invention offers a low energy method where the permeable component (with open pores) to be coated remains at low temperature during the deposit (maximum temperature 400° C.), which allows the use of oxidizing fluid for example air, water, through said component. The deposit is made at low pressure, for example chosen between 1 and 20,000 Pa, which prevents the obstruction of the pores by applying a flow rate and pressure greater upstream of the permeable component to be coated, for example chosen between 10 and 40,000 Pa, therefore below atmospheric pressure. The deposit can be made with oxide precursors, for example ceramics, liquids, gels or solids, (such as nitrates, acetates, chlorides or other liquid organometallics). The diameters of the oxide precursors may be between 100 nm and 2 mm injected in a plasma with power between 60 and 20,000 W. Oxide precursor is understood to mean a chemical object containing at least one element of the oxide and that can activate a reaction forming said oxide.

In one embodiment, the parameters of the method allow the deposit of the oxide: the mass flow rate of the carrier gas loaded with droplets of the oxide precursor, size of droplets of oxide precursor, pressure of the plasma chamber, and power of the plasma are determined previously.

In one embodiment, a fluid is injected upstream and through a permeable component while controlling the pressure of this fluid upstream.

In one embodiment the value of the pressure of said fluid upstream of the permeable component is determined as a function of the shape, size and permeability of the component, such that the pressure of the gas at the outlet of the open pore is always greater than the pressure of the plasma chamber.

In one embodiment, the fluid injection system for the permeable component is regulated using a mass flow rate meter so that the speed of the gas at the outlet of the open pores is greater than the intake speed of oxide precursors on the surface of the permeable material, and does this while retaining plasma stability and the laminar flow.

In one embodiment, the system for feeding the fluid for the permeable component is regulated using mass flow rate meter so that α) the mass flow rate of the fluid circulating in the holes of the permeable component is less than or equal to the mass flow rate of the carrier gas loaded with oxide precursors entering the plasma chamber, and β) the mass flow rate of the fluid circulating in the holes of the permeable component is at least equal to the product of the mass flow rate of the carrier gas loaded with oxide precursors entering the plasma chamber, by the ratio between the total surface area of the open pores of the permeable component and the surface of the passage section of the plasma chamber.

Above the upper limit, the plasma may shut off. Below the lower limit, the gas speed at the outlet of the holes is too low.

In one embodiment, a controller between the pressure of the fluid injected upstream of the component, the pressure of the plasma chamber and the mass flow rate of the carrier gas loaded with oxide precursors is used to control the mass flow rate of the fluid injected into the permeable component within the limits defined in α) and β) while retaining a Reynolds number below 2,100 regardless of the mass flow rate of the carrier gas loaded with oxide precursors.

In one embodiment, the pressure in the plasma chamber is between 1 and 20,000 Pa, preferably between 100 and 10,000 Pa.

In one embodiment, the power of the generator that delivers the electromagnetic waves to create the plasma is between 60 and 20,000 W, preferably between 200 and 10,000 W. In one embodiment, the fluid passing through the permeable component is in the gaseous state and the oxide precursor is in the liquid, gel or solid state. The fluid hardly perturbs the oxide precursor. The fluid can be chosen from air, neutral gases, water and solvents that are chemically compatible with the component to be coated.

In one embodiment, the permeable component presents open pores with diameter between 50 and 1,000 μm. The permeable component can be a perforated part with calibrated holes. The permeable component can be a foam. The permeable component can be a felt. The permeable component can be a stack of hollow spheres.

In one embodiment, the precursor of the oxide is a ceramic precursor comprising at least one organometallic, preferably nitrate, acetate and/or chloride.

In one embodiment, the precursor of the oxide comprises at least one from zirconium nitrates, yttrium nitrates, gadolinium nitrates and europium nitrates, with concentration between 0.005 and 0.5 mole per liter.

In one embodiment, the solution of oxide precursors, such as nitrates, acetates, chlorides or any other liquid organometallic, is introduced by using an injector, for example a spray, a jet, a nebulizer, an atomizer, allowing the production of droplets having diameter between 100 nm and 2 mm.

In one embodiment, the injection is made using a capillary with diameter between 50 and 900 μm.

In one embodiment, the method comprises pulsed injections of the carrier gas loaded with the oxide precursor, followed by injection of carrier gas not loaded with the oxide precursor, with a ratio of injection duration with oxide precursors/injection duration without oxide precursors between 1/5 and 1/30.

In one embodiment, these steps are conducted 6 to 30 times.

In one embodiment, the component is new.

In one embodiment, the alloy comprises a nickel-based superalloy.

The alloy can be monocrystalline for a blade or polycrystalline for a combustion chamber.

In one embodiment, the alloy comprises a cobalt-based superalloy.

In one embodiment, the alloy comprises an iron-based superalloy.

In one embodiment, the alloy comprises a niobium-based superalloy.

In one embodiment, the alloy comprises an aluminum-based superalloy.

In one embodiment, the alloy comprises a copper-based superalloy.

In one embodiment, the pressure of the fluid passing through the permeable component is between 10 and 40,000 Pa, preferably between 200 and 20,000 Pa.

In another embodiment, the component is being repaired.

In one embodiment, the method to repair the component comprises pulsed injections of the carrier gas loaded with the oxide precursor, followed by injection of carrier gas not loaded with the oxide precursor, with a ratio of injection duration with oxide precursors/injection duration without oxide precursors between 1/5 and 1/30 with, from a predetermined cycle, a pressure reduction in the plasma chamber at the start of each cycle.

In one embodiment, the method to repair the component comprises a controller between the pressure of the plasma chamber, the mass flow rate of the carrier gas loaded with oxide precursors, the mass flow rate of the fluid crossing the permeable component and the pressure upstream of the fluid crossing the permeable component.

Other features and benefits of the invention will appear after reading the description that follows, as they relate to the drawings in which.

The Applicant observed that a technique coming from fuel cells was interesting. The reader is invited to refer to FR 2729400 describing a method of depositing a thin layer of metallic oxide for a fuel cell. A substrate is placed in a vacuum chamber communicating with a plasma chamber presenting a convergent nozzle leading to the vacuum chamber through an outlet orifice arranged opposite the substrate and having diameter between 2 and 5 mm. The pressure in the vacuum chamber is between 10 and 2,000 Pa. In the cylindrical plasma chamber with a passage section of about 16 $cm^2$ (diameter of 4.5 cm) a low flow rate of a carrier gas comprising at least the element oxygen is injected continually and a plasma is generated in the plasma chamber by electromagnetic excitation of the carrier gas. An aqueous solution containing at least the metal element is nebulized, thereby generating an aerosol in a loaded carrier gas that has a higher pressure than the pressure in the vacuum chamber and predetermined quantities of the carrier gas loaded with the aerosol are made to enter the plasma chamber sequentially, by aspiration.

However the technique as described by this publication does not allow a permeable component to be coated without clogging its open pores, where the precursor particles have diameters between 100 nm and 1 mm, as disclosed by Cyril Fourmond in "*Synthèse d'oxydes par plasma. Mise au point d'un réacteur plasma pour les tests de résistance au CMAS.*" ["Synthesis of oxides by plasma. Development of a plasma reactor for strength tests at CMAS"] Doctoral thesis from the Université Pierre et Marie Curie defended on Nov. 29, 2011, which corresponds to the pore size range in common porous materials. The part of the particles of oxide precursors whose diameter is lower than that of the unblocking pores may infiltrate these pores.

From the reactor of the method disclosed by FR 2729400, the Applicant has developed a method of forming a layer of oxide on a porous substrate that retains the structural and functional properties of said pores once the coating is obtained.

Figure 1:
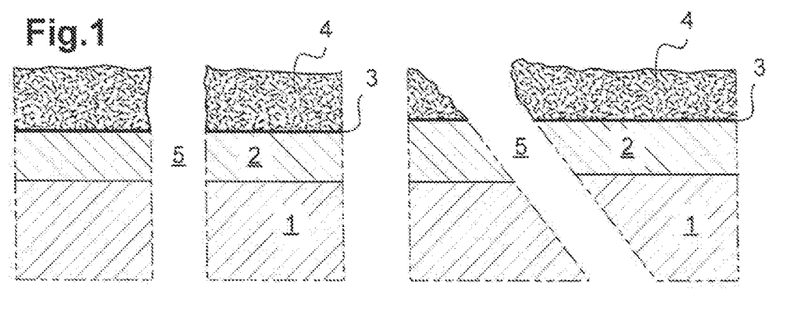
FIG. 1 is a cross-section view of a superalloy component having a layer of oxide.
Figure 2:
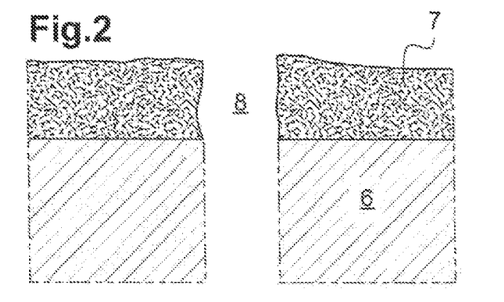
FIG. 2 is a cross-section view of a stainless-steel component having a layer of oxide.
Figure 3:
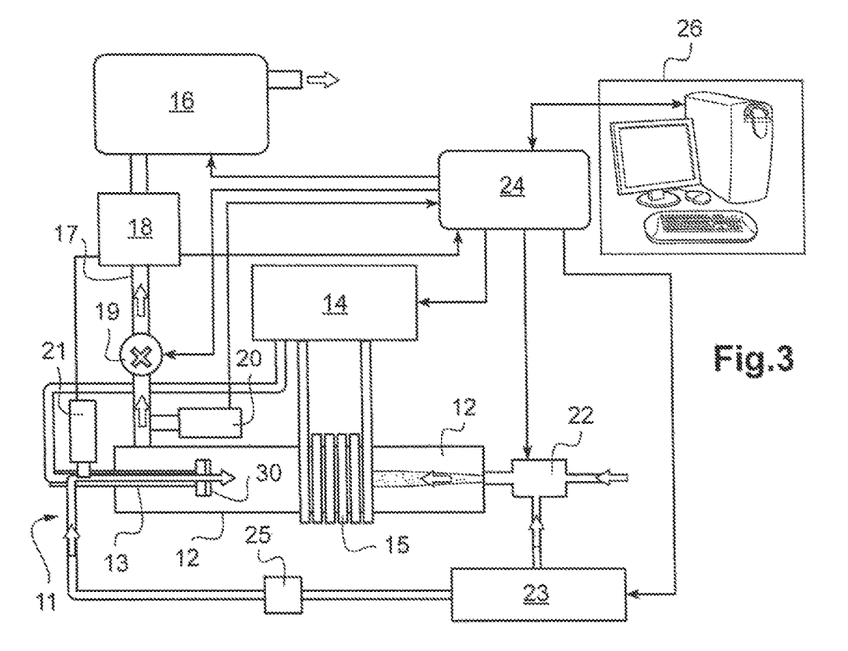
FIG. 3 is a schematic view of a device for implementing the method.

As illustrated in FIG. 1, a component 1 can be a high pressure turbine blade. Component 1 is made of a nickel-based superalloy. Component 1 is coated on its outer face with a binding layer 2 made of an alloy, for example a platinum-modified nickel aluminide. Component 1 is equipped with unblocking cooling channels 5 on the outer face. The binding layer 2 comprises an outer face coated with an oxide layer 3. The binding layer 2 is between 10 and 100 μm thick, preferably between 20 and 50 μm. The binding layer 2 lies on the nickel-based superalloy 1. The oxide layer 3 presents an external face coated with the thermal barrier 4. The oxide layer 3 is between 0.1 and 1 μm thick, preferably between 0.3 and 0.6 μm. The oxide layer 3 may comprise alumina. The thermal barrier 4, for example of zirconium oxide partially stabilized with yttrium oxide, isolates the superalloy from the high temperatures in the turboreactor while preserving the cooling channels. The thermal barrier 4 is between 100 and 150 μm thick. As illustrated in FIG. 2, a component can be a pierced part 6 made of stainless steel. Part 6 is pierced with an unblocking hole 8 on the outer surface and is coated on its outer face with a protective oxide layer 7. The oxide layer 7 is between 5 and 150 μm thick. The oxide layer 7 may comprise zirconium oxide partially stabilized with yttrium oxide. As FIG. 3 shows, the system comprises a plasma chamber 12 in which a substrate carrier 13 is arranged. The component 30 may be installed on the substrate carrier 13. A radio frequency generator 14 feeds inductive coils 15 arranged around plasma chamber 12. The electric mass of the radio frequency generator is connected to substrate carrier 13. A vacuum pump 16 is connected by pipe 17 to the interior of plasma chamber 12. In pipe 17, filters 18 that capture acids and the dusts are provided and at least one controlled actuated valve 19. A pressure gauge 20 is mounted on pipe 17 between the plasma chamber 12 and the actuated valve 19.

The plasma chamber 12 is equipped with a device 22 for introducing carrier gases and injecting oxide precursors and includes a valve. The introduction device 22 is also connected fluidly to a fluid distributor 23 equipped with at least one mass flow rate meter. The introduction device 22 comprises a capillary with fixed or adjustable diameter according to the needs or a nebulizer optionally coupled to a valve to provide the carrier gas and precursors to plasma chamber 12. A pipe 25 is mounted between the fluid distributor 23 and the substrate carrier 13 with a view to providing the fluid to keep open the piercings of the component to be repaired. A pressure gauge 21 is mounted on pipe 25 between the fluid distributor 23 and the plasma chamber 12.

A control, acquisition and command case 24 is connected to pressure gauge outlets 20 and 21. The control case 24 comprises control outlets connected to the vacuum pump 16, the radio frequency generator 14, the control valve 19, the introduction device 22 and the fluid distributor 23. The case 24 is also in communication with a computer 26 equipped with an acquisition card and stored with data for using the controller.

Figure 4:
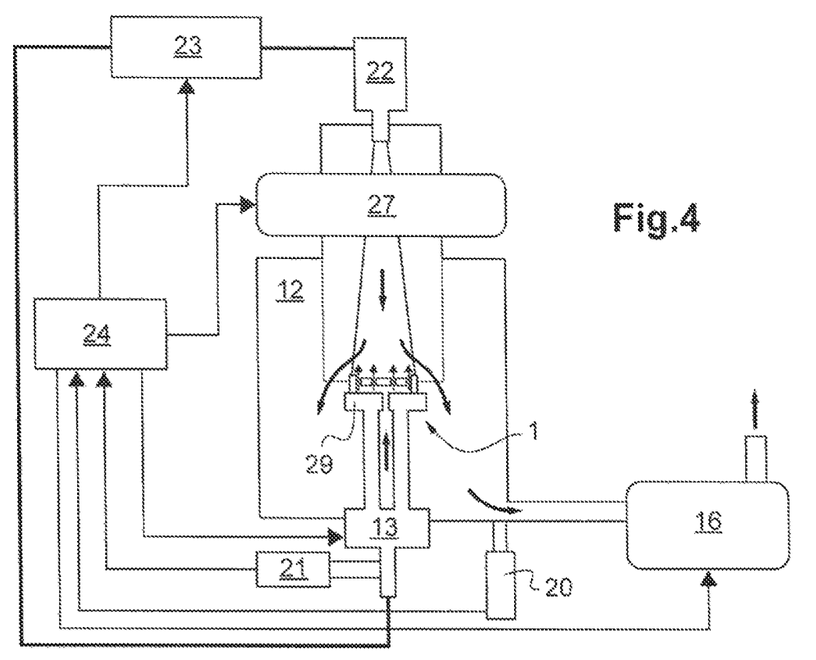
FIG. 4 is a general drawing of a device for implementing the method.

In FIG. 4, some elements of FIG. 3 have been omitted to improve legibility.

FIG. 4 shows a more general drawing of the system of implementing method. The system comprises a plasma chamber 12 topped by a plasma source 27 and equipped with the introduction device 22. The vacuum pump 16 can change the pressure in the plasma chamber 12. The pressure is controlled in the plasma chamber 12 by a gauge 20 and in the substrate carrier 13 by a gauge 21. The control case 24 commands and controls the method in its entirety. The control case 24 allows the control of pressures and flow rates of carrier gas loaded with oxide precursors in the fluid distributor 23 connected to the introduction device 22, and of the flow rate of fluid injected upstream of the substrate carrier 13, which makes a seal with the permeable component 30.

On the substrate carrier 13 is mounted a sealed connector 29 that supports the permeable component 30. The connector 29 is sealed in the sense that the fluid flow from the substrate carrier 13 can only flow through the pores of the permeable component 30.

In operation, the plasma chamber simultaneously receives a gas, coming from the permeable component to be coated and a carrier gas loaded or not loaded with oxide precursors in a low pressure plasma. The fluid circulating through the permeable component prevents the oxide being deposited in the pores.

The component to be coated is made from a material or set of materials that is stable at 400° C. The surface of the component to be coated may cover all or part of the outer surface of the component. At least one pore with diameter between 50 and 1,000 μm unblocks on the outer surface. A carrier gas loaded with droplets of at least one oxide precursor is injected into a low pressure plasma in a plasma reactor enclosure in which the component is installed. A fluid passing through at least one pore of the component in the gaseous state is injected. The gas flows through the pore in the plasma chamber, preventing clogging of the pore. The pressure of the fluid upstream of the permeable component being such that the pressure of the gas at the outlet of the pore is greater than the pressure in the plasma chamber. A carrier gas not loaded with oxide precursor is injected in a plasma within a plasma chamber. The steps of injecting carrier gas that is loaded and not loaded are repeated, thereby forming on the outer surface said oxide. The pore diameter is preserved.

The invention is further illustrated by the following examples.

EXAMPLE 1

Figure 5A:
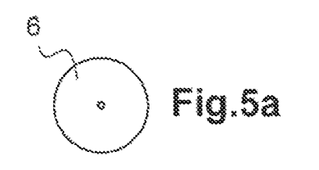
FIGS. 5a to 5c are views of a component during the steps of the method.
Figure 5B:
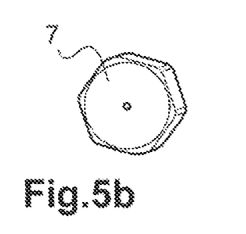

The permeable component 30 to be coated by a porous oxide layer is here a hexagonal piece 6 made of stainless steel (12 mm sides) pierced in the center with a hole 8 that is 0.6 mm in diameter as shown in FIG. 5a. The hole must remain free for gas to circulate through the piece. The oxide to deposit is for example zirconium oxide partially stabilized with yttrium oxide. The method is regulated manually.

The permeable piece to be coated is attached in the plasma chamber 12 shown in FIG. 3, with diameter of 50 mm, and connected through a sealed system to the rotating substrate carrier 13 and to a fluid network constituted of a tube with internal diameter ¼ inch, i.e. 6.35 mm. The substrate carrier can be heated or cooled (10-600° C.). The plasma is generated in the plasma chamber through 5 or 6 inductive coils 15 wherein a radio frequency electric current at 40 MHz circulates. The generator 14 used to provide this current is a TOCCO-STEL generator that can transfer powers between 60 and 600 W to the carrier gases. This generator can be split into two distinct parts. The first part is a compartment that creates a high voltage continuous current from the mains three-phase current. I and U can be read on the generator's screens. The second part is a compartment that produces the high frequency current (MHz) that crosses coils 15. For this, said compartment is equipped with a triode and equipped with a self-oscillating circuit comprising inductances and capacitances. The plasma can be generated by capacitive or inductive means. Under the power and pressure transfer conditions in this example, the plasma appears as being generated by inductive means. The coils 15 placed upstream of the substrate carrier surround the chamber 12, for example a quartz tube, and allow a plasma to be initiated and maintained. The chamber may comprise a quartz tube. As well as containing excited and oxidizing chemical reagents, the plasma will heat the material flow circulating in the plasma chamber.

The conditions previously determined for depositing the zirconium oxide stabilized with yttrium oxide are carrier gas flow rates (Ar: 2.1 L/min i.e. $6.2\ 10^{-5}$ kg/s, $N_2$: 0.275 L/min i.e. $5.7 10^{-6}$ kg/s, and $O_2$: 0.22 L/min i.e. $5.2 10^{-6}$ kg/s in the Standard Temperature (25° C.) and Pressure (100,000 Pa) conditions—(STP) loaded by an aqueous solution containing the oxide precursors (zirconium (IV) oxynitrate hydrate and yttrium nitrate—molar ratio 8.5/1) injected with a flow rate of 0.7 mL/min. The maximum flow rate of carrier gas loaded with oxide precursors is therefore $7.3\ 10^{-5}$ kg/s and the pressure varies from 760 Pa (pulse of carrier gas not loaded with oxide precursor) to 1,000 Pa (pulse of carrier gas loaded with oxide precursor).

The method begins by turning on the pump system (vacuum pump 16) to put the deposit chamber into low pressure (pressure: 500 Pa). The pressure is controlled using a MKSA 20 gauge. The fluid intake at the substrate carrier is then opened and the air coming from the experimentation room is suctioned. The excess pressure at the substrate carrier 13, upstream of the piece, is then 10,000 Pa. The excess pressure is controlled by a MKSA pressure gauge 21 connected to the fluid circulation system in the substrate carrier. The air intake that comes through the hole of the piece then causes an increase in pressure in the deposit chamber up to a value of 700 Pa. The pressure of the air at the outlet of the hole is then around 10,000 Pa because the load losses are low in this configuration (only 1 hole). The flow rate of the air circulating is set at $1.3810^{-5}$ kg/s (0.7 L/min) (STP) using a mass flow rate meter contained in the fluid distributor 23. Said air mass flow rate of $1.3810^{-5}$ kg/s is located between the two limits defined. Said air mass flow rate is less than the total mass flow rate for carrier gases loaded with the oxide precursor ($7.3\ 10^{-5}$ kg/s) entering the plasma chamber (upper limit). Said air mass flow rate is greater than the product of the value of the total mass flow rate of the carrier gases loaded with oxide precursor entering the plasma chamber, by the ratio between the total surface area of the open pores in the permeable piece and the surface area of the passage section of the plasma chamber, a value equal to $7.3\ 10^{-5}*(0.6/50)^2 = 1.06\ 10^{-8}$ kg/s.

The Reynolds number is expressed as a function of the mass flow rate $Q_{m\ STP}$ according to $$Re = (Q_{m\ STP}*D)/(\mu*\text{Surface of the open pore})$$

Where $Q_{STP}$=mass flow rate in Standard Pressure and Temperature conditions (here $1.3810^{-5}$ kg/s)

D=representative pore diameter (here 0.6 mm=$600\ 10^{-6}$ meter)

$\mu$=dynamic viscosity of the fluid injected, here $\mu_{air}$ equal to $2.1\ 10^{-5}$ Pa at 10,000 Pa, and the surface area of the open pores is equal here to $\pi D^2/4$ in $m^2$ the value of the Reynolds number is calculated to be $Re = (4*Q_{m\ STP}*D)/(\mu*\pi D^2)$ $$Re = (4*Q_{m\ STP})/(\mu*\pi D) = 1391$$

The regime is indeed laminar because the Reynolds number is below 2100.

The generator is then switched on to initiate the plasma. The power of the generator delivering the electromagnetic waves emitted is adjusted in this example to a value of 200 W. The device for introduction 22 is then turned on almost immediately to introduce the carrier gas (Ar: 2.1 L/min, $N_2$: 0.275 L/min, and $O_2$: 0.22 L/min in STP conditions) and the aqueous solution containing the oxide precursors (the zirconium (IV) oxynitrate hydrate and yttrium nitrate—molar ratio 8.5/1—flow rate 0.7 mL/min). The injection system operates in pulse mode (active for 0.2 s and inactive for 2 s) and forms a jet of carrier gas loaded in the plasma chamber that includes micrometer droplets of nitrates in liquid/gel state. The pressure in the plasma chamber increases to 1,000 Pa when the injection system is active and falls back to 760 Pa when it is inactive. The pulsed injection step for carrier gases loaded with oxide precursors occurs for 2 minutes. The plasma, fed by the carrier gases loaded and by the water that evaporates, includes species such as O and OH that will act on the oxidation of nitrates in the deposit chamber. The droplets of oxide precursors circulating with the jet of loaded carrier gas impact the substrate and form a layer of oxide because of the plasma's oxidizing properties. The flow rate of the air exiting the hole of the piece naturally opposes the deposit of the material because of the excess pressure compared with the flows of the loaded carrier gases and the droplets that oppose it. During experiments, the absence of nitrates having penetrated or infiltrated into the hole is observed. Clogging is prevented. The flow rate of nitrates is then cut so that only the carrier gases penetrate the plasma chamber via the injection system. The flow rate of air entering the piece to be coated is maintained. This 8-minute long step is called "post-treatment". This step aims to perfect the oxidation of nitrates deposited on the piece to be coated (mainly action of O and OH coming from the residual water in the plasma chamber and in the layer of oxide). The temperature of the piece to be coated does not exceed 400° C.

Figure 5C:
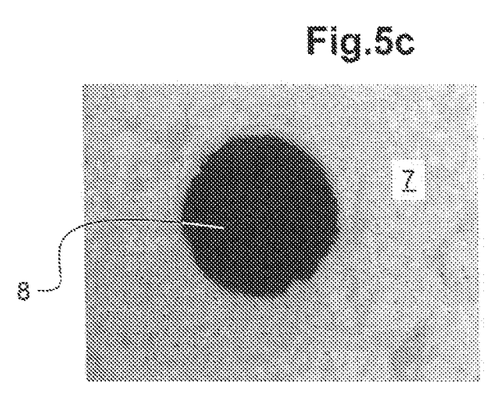

The deposit speed is between 15 and 25 µm/h. The injection/post-treatment steps are repeated n times so as to obtain a layer of zirconium oxide partially stabilized with yttrium oxide that is of the order of 150 µm thick. Once the oxide is deposited on the pierced piece, the entire device is shut down (electricity/gas/pumping device system). The plasma chamber is returned to atmospheric pressure then the substrate carrier is removed from the deposit chamber. Piece 6, which was shiny stainless steel before the deposit FIG. 5*a* appears coated with a white layer of oxide 7 with a hole 8 clearly visible in its center (FIG. 5*c*). Once liberated from the substrate carrier, the coated piece 6 is placed under an optical microscope to observe the hole 8 and the deposited layer 7. Observation of the hole 8 shows that its diameter is 600 µm, i.e. the same value as the diameter of the initial hole before deposit. This means that the exiting air flow prevents the deposit from starting to clog hole 8 of the hexagonal piece 6, even in a moderate manner on the edge. The layer obtained after the injection/post-treatment cycles presents a clearly visible crystalline structure at the reactor outlet on the diffraction spectra while the temperature in the plasma remains moderate.

The oxide deposit then undergoes annealing where the temperature is 1,100° C. (heating/cooling 50° C./h). This thermal treatment conserves the hole present in the coated piece. The annealing allows removal of any traces of nitrates and water and perfects crystallization of the deposit. It is also the origin of a growth and stabilization process for the grains that constitute the porous layer.

The deposit method cited here therefore allows a stainless steel piece 6 pierced with a hole 8 to be coated (FIG. 5*a*) with a layer of oxide 7 with an anti-clogging effect while said hole is crossed by an air flow during the deposit phase. The layer deposited on the piece to change its surface properties does not influence the presence or size of the hole. Therefore it remains free and can continue to meet a function of draining gas after the oxide layer is deposited.

EXAMPLE 2

The method is as in example 1 except that the component is for example a high-pressure turbine blade. This can also be a portion of a multi-perforated combustion chamber in a turboreactor. The blade, with surface area 28 cm², presents perforations with diameter 0.5 mm on 5% of the total surface area. The blade must be coated with a thermal barrier, typically an oxide such as zirconium oxide partially stabilized with yttrium oxide to isolate the superalloy from the high temperatures in the turboreactor. The oxide must therefore coat the blade, respecting the perforations. The blade is placed in a plasma chamber with diameter 10 cm, (passage section 78.5 cm²), therefore larger than that of example 1. This device has a system for introducing resized carrier gases and reagents (operating on the same principle as that cited in example 1) and is equipped with another device for creating the plasma. It comprises a system for generating and transporting microwave energy. The microwave energy is created by two SAIREM GMP 20 KE/D type microwave generators in pulse mode (2.45 GHz) with power adjustable from 200 to 10,000 W placed opposite each other. The energy is injected by two brass waveguides arranged around a quartz tube overhanging the deposit chamber. This coupling with the carrier gas is done in a steel cylindrical exciter. The plasma is generated by capacitive means.

An argon/nitrogen/oxygen/water vapor plasma is triggered under the following conditions: Wattage: 2600 W pressure: 780 to 1,000 Pa argon flow rate 2.1 L/min STP, nitrogen flow rate 0.275 L/min STP, oxygen flow rate 0.22 L/min STP, water flow rate: 1.5 mL/min by 2-minute pulsed injections (using the following cycle: valve open time 0.2 second and valve close time 2 seconds), duration 90 minutes, to create a TGO-type oxide layer a maximum of 0.5 µm thick, before depositing the chosen oxide, here zirconium oxide partially stabilized with yttrium oxide.

The initial conditions for the deposit chosen are an argon/oxygen plasma with a total carrier gas flow rate of 12 L/min STP. The oxygen flow rate is 5 L/min STP i.e. 1.2 $10^{-4}$ kg/s STP and the argon flow rate is 7 L/min STP i.e. 2.1 $10^{-4}$ kg/s STP with a flow rate of precursors zirconium (IV) oxynitrate hydrate and yttrium nitrate equal to 20 mL/min.

The pressure of the plasma chamber varies up to 10,000 Pa (pulse of carrier gas loaded with oxide precursor).

The pressure upstream of the permeable blade to be coated is set at 20,000 Pa.

The flow rate of air injected through the permeable blade is 5 L/min STP i.e. a mass flow rate of 0.98 $10^{-4}$ kg/s.

The mass flow rate of air injected is less than the value of the total mass flow rate of carrier gas loaded with oxide precursors (3.3 $10^{-4}$ kg/s)—maximum limit—and is greater than the value of the total mass flow rate of the carrier gases loaded with the oxide precursor entering the plasma chamber multiplied by the ratio between the total surface area of the open pores of the permeable blade and the surface of the passage section of the plasma chamber, value of 3.3 $10^{-4}$ g/s*[(0.05*28)/(78.5)]=5.8 $10^{-6}$ kg/s—lower limit.

A calculation equivalent to example 1 confirms that the Reynolds number (here 14) is indeed below 2,100.

After n injection/post-treatment cycles, and applying regulation on pressures and flow rates as described previously, on the blade a thermal barrier of zirconium oxide partially stabilized with yttrium oxide is obtained with the cooling holes conserved as FIG. 1 illustrates.

The deposit method described here therefore allows thermal isolation by a zirconium oxide partially stabilized with yttrium 4, a superalloy 1 previously coated with a binding layer 2 while preserving the cooling circuits 5 perpendicular or not to the surface. The cooling circuits 5 remain open after the oxide 3 is formed and the oxide is deposited.

EXAMPLE 3

The method is as in example 2 except that the component is a section of combustion chamber constituted of a porous nickel-based metal foam including holes having diameter between 50 and 500 µm on a surface area equivalent to 30% of the chamber section. The chamber section having surface area 30 cm² must be coated with a thermal barrier, typically of zirconium oxide partially stabilized with yttrium oxide. The operation protocol is the same as that cited in example 2, the regulation of the mass flow rate of fluid injected into the permeable chamber section and of the pressure at the outlet of holes taking into account the fact that the chamber section is a foam with high surface porosity (calculation of the lower limit). Identical results are obtained to those in example 2 i.e. the open pores are conserved (not clogged) while the thermal barrier coats the foam well.

EXAMPLE 4

The method is as in example 2 except that the component is a section of a combustion chamber constituted of a cobalt-based alloy, of its binding layer and of a thermal barrier of zirconium oxide partially stabilized with yttrium oxide, and including unblocking cooling channels on the surface having a diameter of 500 µm. Some areas of the chamber section must be coated with a protective oxide, also called an environmental barrier, such as for example gadolinium zirconate $Gd_2Zr_2O_7$ or neodymium zirconate $Nd_2Zr_2O_7$, to prevent local degradation of the chamber section by aggressive agents such as aluminum, silicon or magnesium silicates, which may be present in engine turbines. The conditions for depositing the protective oxide must keep cooling channels in the chamber section open, preventing clogging in them. The parts of the chamber section that are not to be covered with $Gd_2Zr_2O_7$ are masked, for example with an aluminum sheet. The $Gd_2Zr_2O_7$ deposit conditions are the same as those cited in example 2, with the exception of the step of forming a TGO-type oxide layer, not applied here, and precursors injected that are here zirconium (IV) hydrate oxynitrate $ZrO(NO_3)_2,6H_2O$ and gadolinium nitrate hydrate $Gd(NO_3)_3,6H_2O$ or neodymium nitrate hydrate $Nd((NO_3)_3,6H_2O$. Identical results are obtained to those presented in example 2, i.e. the open pores are intact.

EXAMPLE 5

It is an example of repairing a used component.

The component is for example a high pressure turbine blade of a turboreactor having cooling channels with average diameter 500 µm typically unblocking at the leading edge and the trailing edge.

The external layer of the thermal barrier is developed by EB-PVD and comprises the zirconium oxide partially stabilized with yttrium oxide (YpSZ). The thermal barrier is between 100 and 150 µm thick. The external layer of the thermal barrier lies on a layer of oxide called TGO (Thermally Grown Oxide) 0.5 µm thick, for example. The oxide layer was created in situ while the YpSZ thermal barrier was deposited. The layer of oxide lies itself on an inner layer, for example a nickel aluminide modified with platinum or doped with zirconium. The inner layer is between 20 and 50 µm thick. The internal layer itself lies on the monocrystalline nickel-based superalloy.

After operation sometimes the blade has scales from a few mm² to a few cm² with many lengthwise delamination cracks between the thermal barrier and the substrate.

The blade is then lightly sanded, for example dry sanded using corundum, to clean the blade of non-adhesive thermal barrier portions.

Then the blade is placed in the low pressure plasma chamber of the system described in example 2 and connected to the substrate carrier as in example 2. The healthy parts of the blade that are not to be repaired can be protected by a mask, for example an aluminum sheet. The blade undergoes a series of cleaning in the plasma chamber as described below.

The generator is switched on to initiate the plasma (t0). A hydrogen plasma is then created to operate blade cleaning under the following conditions: Power of the generator that deliver electromagnetic waves emitted: 2000 W, Pressure: 560 to 650 Pa, argon flow rate 1.8 L/min STP, nitrogen flow rate 0.215 L/min STP, hydrogen flow rate 0.1 L/min STP, duration: 25 minutes. Since the region to be repaired is then cleared of impurities and compounds that adhere poorly, the oxide layer promoting adhesion is formed. An argon/nitrogen/oxygen/water vapor plasma is triggered under the following conditions: Wattage: 2600 W pressure: 780 to 1,000 Pa argon flow rate 2.1 L/min STP, nitrogen flow rate 0.275 L/min STP, oxygen flow rate 0.22 L/min STP, water flow rate: 1.5 mL/min by pulsed 2-minute injections (using the following cycle: valve open time 0.2 second and valve close time 2 seconds), duration 90 minutes, to recreate the TGO oxide layer in the places where it came off.

The argon/nitrogen/oxygen plasma is used in the previously cited conditions. The reactor pressure is then increased up to 5,300 Pa, the mass flow rate of the fluid injected into the permeable blade is kept equal to the mass flow rate total of the carrier gases loaded with oxide precursors, and the pressure upstream of the blade to be coated is 2,000 Pa greater than the reactor pressure, the power of the generator is between 2,000 and 2,600 W and a solution of zirconium oxynitrate hydrate and yttrium nitrate ($ZrO(NO_3)_2$, $6H_2O$ and $Y(NO_3)_2$ (molar ratio 8.5/1)) is sprayed (capillary diameter 500 µm), with a flow rate of 1.5 cm³/min, by pulsed 2-minute injections (using the following cycle: valve open time 0.2 second and valve close time 2 seconds) in the plasma (t1–t2). The conductivity and pH of the solution injected are measured continuously.

During this step, zirconium and yttrium nitrates undergo the action of O and OH species while in flight as well as on the substrate. The pressure conditions in the plasma chamber and the power generated by the plasma chamber in combination with the size of the droplets produced by the injector, mean that the nitrates arrive on the substrate in liquid state and can infiltrate lengthwise cracks and delamination cracks between the substrate and the thermal barrier.

The next step is a post-treatment step that lasts in the order of 8 minutes consisting in maintaining the flow rates of plasmagenic carrier gases and the plasma turned on. Accordingly, the zirconium and yttrium nitrates that are deposited in and on the substrate still undergo the oxidizing chemistry of the plasma, principally the action of O, since the solution is no longer introduced during this step. Further, the plasma chamber can also be fed with water so as to produce OH radicals during the post-treatment. The temperature in the substrate carrier remains below 400° C.

The injection/post-treatment cycles are repeated 10 times then the pressure of the reactor is reduced by 200 Pa at the start of each cycle where the carrier gas loaded with oxide precursors is introduced up to the 20th cycle or when the oxide thickness deposited is satisfactory for the repair.

At the start of each cycle, the mass flow rate for fluid introduction through the blade is controlled so as to remain in the laminar domain in spite of reduced pressure in the plasma chamber, while being greater than the mass flow rate of the carrier gas loaded with oxide precursors multiplied by the ratio of the total surface area of open pores on the permeable blade to the passage section of the plasma chamber.

The method described above allows local repair of the thermal barrier, while preserving the cooling channels, by recreating on the sub-layer a layer of oxide where the initial thermal barrier and the initial TGO come apart and by infiltrating a new layer of ceramic thereby allowing the initial thermal barrier to be reattached. This prevents the operation of repiercing holes.

EXAMPLE 6

The method is as in example 5 except that the fluid mass flow rate is introduced in the permeable blade at the end of the cleaning step with hydrogen and before the pre-oxidation step to recreate the TGO-type oxide.

The method is then controlled such that the mass flow rate of fluid circulating through the blade is regulated by the control case 24. The control program for the computer 26 acts on the injection system 22 via the control case 24, such that the mass flow rate of fluid circulating through the permeable blade is between the minimum and maximum limits and its value preferably generates a Reynolds number below 2,100.

The invention claimed is:

1. A method of forming a layer of oxide on a permeable component made of a material or a stack of materials that is stable at 400° C., said component comprising an outer surface to be coated and at least one pore having diameter between 50 and 1000 μm unblocking at said outer surface, comprising the following steps:
   a) Injecting a carrier gas loaded with droplets of at least one precursor of the oxide in a low-pressure plasma inside an enclosure of a plasma reactor housing the component to be coated, and injecting a fluid passing through the permeable component and flowing in the gaseous state through at least one pore with flow opposite that of the carrier gas in the plasma chamber to prevent clogging the pore, the pressure and the mass flow rate of said fluid upstream of the permeable component being such that the pressure of the gas at the outlet of the at least one pore is greater than the pressure in the plasma chamber and that the injection mass flow rate of the fluid passing through the permeable component is:
   α) less than or equal to the mass flow rate of the carrier gas loaded with oxide precursors injected into the plasma chamber; and
   β) greater than or equal to the product of the mass flow rate of the carrier gas loaded with oxide precursors injected into the plasma chamber by the ratio between the total surface area of the open pores of the permeable component and the surface area of the passage section of the plasma chamber;
   accordingly, the speed of the gas at the outlet of the at least one pore is greater than or equal to the intake speed of the carrier gas loaded with at least one precursor of the oxide in any of these states—liquid, gel or solid—on the outer surface of the component,
   b) Injecting a carrier gas not loaded with oxide precursor in a plasma within the plasma chamber, injecting the fluid passing through the permeable component being maintained
   steps a) and b) being repeated, to form on the outer surface said oxide, the diameter of the at least one pore being preserved.

2. The method as claimed in claim 1, wherein, in step a), the injection of the fluid passing through the permeable component is conducted by controlling the pressure of the fluid upstream of the permeable component, the mass flow rate of the carrier gas loaded with droplets of the oxide precursor, and the pressure in the plasma chamber.

3. The method as claimed in claim 2, wherein a controller between the pressure of the fluid injected, upstream of the component, the pressure of the plasma chamber and the mass flow rate of the carrier gas loaded with oxide precursors is used to control the mass flow rate of the fluid injected into the permeable component in the limits defined in α) and β) while optionally retaining a Reynolds number below 2,100 regardless of the mass flow rate of the carrier gas loaded with oxide precursors.

4. The method as claimed in claim 1, wherein the fluid passing through the permeable component is in the gaseous state and the precursor is in the liquid, gel or solid state.

5. The method as claimed in claim 1, wherein the pressure in the plasma chamber is between 1 and 20,000 Pa.

6. The method as claimed in claim 1, wherein the pressure of the fluid passing through the permeable component is between 10 and 40,000 Pa.

7. The method as claimed in claim 1, wherein an electromagnetic wave generator used to create the plasma is regulated to transfer to the plasma a power between 60 and 20,000 W.

8. The method as claimed in claim 1, wherein the permeable component has open pores with diameter between 50 and 1,000 μm.

9. The method as claimed in claim 1, wherein the droplets have a diameter between 100 nm and 2 mm in the liquid, gel or solid state.

10. The method as claimed in claim 1, wherein the temperature of the permeable component remains below 400° C.

11. The method as claimed in claim 1, wherein the oxide precursor is a ceramic precursor comprising at least one organometallic, preferably nitrate, acetate and/or chloride.

12. The method as claimed in claim 1, wherein the component is new.

13. The method as claimed in claim 1, wherein the component is being repaired.

14. The method as claimed in claim 1, wherein the component comprises a superalloy with a base chosen from at least one of nickel, cobalt, iron, copper, aluminum, niobium.

* * * * *